United States Patent [19]
Manley

[11] Patent Number: 5,980,707
[45] Date of Patent: Nov. 9, 1999

[54] APPARATUS AND METHOD FOR A MAGNETRON CATHODE WITH MOVING MAGNET ASSEMBLY

[75] Inventor: Barry W. Manley, Boulder, Colo.

[73] Assignee: Sierra Applied Sciences, Inc., Boulder, Colo.

[21] Appl. No.: 09/217,545

[22] Filed: Dec. 18, 1998

[51] Int. Cl.⁶ .................................................. C23C 14/32
[52] U.S. Cl. ................................ 204/298.2; 204/192.12; 204/298.16; 204/298.17
[58] Field of Search ........................... 204/298.16, 298.2, 204/298.17, 192.12, 298.19, 298.22

[56] References Cited

U.S. PATENT DOCUMENTS

| | | | |
|---|---|---|---|
| 3,956,093 | 5/1976 | McLeod | 204/192.12 |
| 4,356,073 | 10/1982 | McKelvey | 204/192.12 |
| 4,401,539 | 8/1983 | Abe et al. | 204/192.13 |
| 4,434,037 | 2/1984 | Crank | 204/192.12 |
| 4,444,643 | 4/1984 | Garrett | 204/298.2 |
| 4,500,409 | 2/1985 | Boys et al. | 204/298.03 |
| 4,810,346 | 3/1989 | Wolf et al. | 204/298.12 |
| 4,872,964 | 10/1989 | Suzuki et al. | 204/298.2 |
| 5,262,028 | 11/1993 | Manley | 204/298.16 |
| 5,284,564 | 2/1994 | Maass | 204/298.2 |
| 5,314,597 | 5/1994 | Harra | 204/192.13 |
| 5,328,585 | 7/1994 | Stevenson et al. | 204/298.2 |
| 5,399,253 | 3/1995 | Gruenfelder | 204/298.2 |
| 5,865,970 | 2/1999 | Stelter | 204/298.16 |

FOREIGN PATENT DOCUMENTS

| | | | |
|---|---|---|---|
| 63-290275 | 11/1988 | Japan | 204/298.2 |
| 4-350162 | 12/1992 | Japan | 204/298.2 |

*Primary Examiner*—Nam Nguyen
*Assistant Examiner*—Gregg Cantelmo
*Attorney, Agent, or Firm*—Bruce E. Dahl, Esq.; Dahl & Osterloth LLP

[57] ABSTRACT

A magnet assembly may comprise a first magnet plate having a first magnet mounted thereon and a second magnet plate having a second magnet mounted thereon and a third magnet mounted thereon adjacent the second magnet so that a pole axis of the second magnet is substantially perpendicular to a pole axis of the third magnet. The second magnet plate is positioned adjacent the first magnet plate so that a plasma-confining magnetic field is created between the first, second, and third magnets. The first and second magnet plates are also moveable with respect to one another so that they can be moved between a center position configuration and an end position configuration. An actuator operatively associated with the first and second magnet plates moves the first and second magnet plates with respect to one another so that the first and second magnet plates are located at about the center position configuration for a time that is greater than a time that the first and second magnet plates are located at about the end position configuration.

21 Claims, 9 Drawing Sheets

APPARATUS AND METHOD FOR A MAGNETRON CATHODE WITH MOVING MAGNET ASSEMBLY

FIELD OF INVENTION

This invention relates to plasma processing systems in general and more specifically to magnetron sputter deposition systems.

BACKGROUND

Plasma deposition refers to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Plasma deposition processes may also be used to apply coatings to various objects to improve or change the properties of the objects. For example, plasma deposition processes may be used to apply wear resistant coatings to machine tools, while other types of coatings may be used to increase the corrosion resistance of other items, such as bearings, turbine blades, etc., thereby enhancing their performance. In still other applications, plasma deposition may be used to apply coatings to various types of surfaces in the optics and glass industries.

In most plasma deposition processes the plasma is created by subjecting a low-pressure process gas (e.g., argon) contained within a vacuum chamber to an electric field. The electric field, which is typically created between two electrodes, ionizes the process gas, creating the plasma. If direct current (DC) is used to produce the electric field, the negatively charged electrode is usually referred to as the cathode, whereas the positively charged electrode is referred to as the anode. Thus, in the case of a DC sputter deposition plasma process, the material to be deposited on the object or substrate is usually connected as the cathode, whereas some other element, typically the vacuum chamber itself, is connected as the anode. Ionized process gas atoms comprising the plasma are accelerated toward the negatively charged cathode which also includes a target containing the material to be deposited on the substrate. The process gas atoms ultimately impact the target material and dislodge or sputter atoms from the target, whereupon the sputtered atoms subsequently condense on various items in the chamber, including the substrate that is to be coated. The substrate is usually positioned with respect to the target so that a majority of the sputtered target atoms condense onto the surface of the substrate.

While sputter deposition processes of the type described above may be used to deposit a wide variety of materials (e.g., metals and metal alloys) onto various substrates, they may be used to deposit compound materials as well. Reactive sputter deposition is the name usually given to sputtering processes which involve the sputtering of the target in the presence of a reactive species (e.g., oxygen or nitrogen gas) in order to deposit a film comprising the sputtered target material and the reactive species. A wide variety of compounds, such as $SiO_2$, $Al_2O_3$, $Si_3N_4$, and $TiO$, can be deposited by reactive sputter deposition processes.

Regardless of the particular type of sputtering process being performed (e.g., non-reactive or reactive), the sputtering yield, i.e., the number of target atoms sputtered per incident ion, depends on the energies of the incident ions. The overall sputtering rate depends on both the energies of the incident ions as well as the total number of ions bombarding the target surface during a given time period. Therefore, in order to maximize sputtering efficiency, it is desirable to produce and confine the ions and electrons in the glow discharge as close as possible to the surface of the target material. Towards this end, numerous kinds of magnetically assisted sputtering cathodes or magnetrons have been developed which utilize magnetic fields to confine the glow discharge in a region close to the surface of the target being sputtered.

A typical planar magnetron may include a plate-like or planar target along with a magnet assembly suitable for producing a plasma-confining magnetic field adjacent the target. While numerous shapes and configurations of plasma-confining magnetic fields have been developed and used with varying degrees of success, it is common to shape the plasma-confining magnetic field so that it forms a closed loop ring or "racetrack" over the surface of the target material. When viewed in cross section, the flux lines of the magnetic field loop or arch over the surface of the target, forming a magnetic tunnel, which confines the glow discharge to the ring or racetrack shaped sputtering region. The shape of the predominate electron path defines the portion of the target material that will be sputtered.

Unfortunately, in most conventional magnetrons having such ring shaped or racetrack shaped magnetic tunnels, the arched shape of the magnetic field over the target surface tends to force or "pinch" the electrons, thus the predominate electron path, toward the center of the tunnel. This pinching effect causes the plasma density and, therefore, the sputtering erosion, to be highest along the centerline of the tunnel. As the target is gradually eroded, the pinching forces tend to strengthen, ultimately resulting in a V-shaped erosion groove in the target. The fraction of the target material that has been sputtered away by the time the bottom of the V-shaped erosion groove reaches the back surface of the target is referred to herein as the target utilization. In most magnetrons, the target utilization is relatively low, in the range of about 20% to 30%. Since the commonly used target materials tend to be relatively expensive, such low target utilization is wasteful and increases the costs associated with the sputtering process. For example, although spent targets may be recycled and reworked into new targets, the time spent changing and reworking targets can be significant and in any event, increases the overall cost of the sputtering operation. Therefore, any significant increase in target utilization translates directly into cost savings, as the increased target utilization enables longer production runs and less downtime spent in reworking and replacing targets.

SUMMARY OF THE INVENTION

A magnet assembly for producing a plasma-confining magnetic field over the surface of a target may comprise a first magnet plate having a first magnet mounted thereon and a second magnet plate having a second magnet mounted thereon and a third magnet mounted thereon at a position adjacent the second magnet so that a pole axis of the second magnet is substantially perpendicular to a pole axis of the third magnet. The second magnet plate is positioned adjacent the first magnet plate so that the plasma-confining magnetic field is located between the first and second magnets. The first and second magnet plates are also moveable with respect to one another so that they can be moved between a center position configuration and an end position configuration. An actuator operatively associated with the first and second magnet plates moves the first and second magnet plates with respect to one another so that the first and second magnet plates are located at about the center position configuration for a time that is greater than a time that the first and second magnet plates are located at about the end position configuration.

Also disclosed is a method for producing a plasma confining magnetic field over a front surface of a target. The method may comprise the steps of: Positioning a magnet assembly adjacent a back surface of the target, the magnet assembly including a stationary magnet plate having a first magnet positioned thereon and a moveable magnet plate having a second magnet positioned thereon and a third magnet positioned thereon so that a pole axis of the second magnet is substantially perpendicular to a pole axis of the third magnet and so that the plasma confining magnetic field is established between the first, second, and third magnets, the moveable magnet plate being moveable between a center position and an end position; and moving the moveable magnet plate with respect to the stationary magnet plate so that the moveable magnet plate is located at about the center position for a time that is greater than a time when the moveable magnet plate is located at about the end position.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
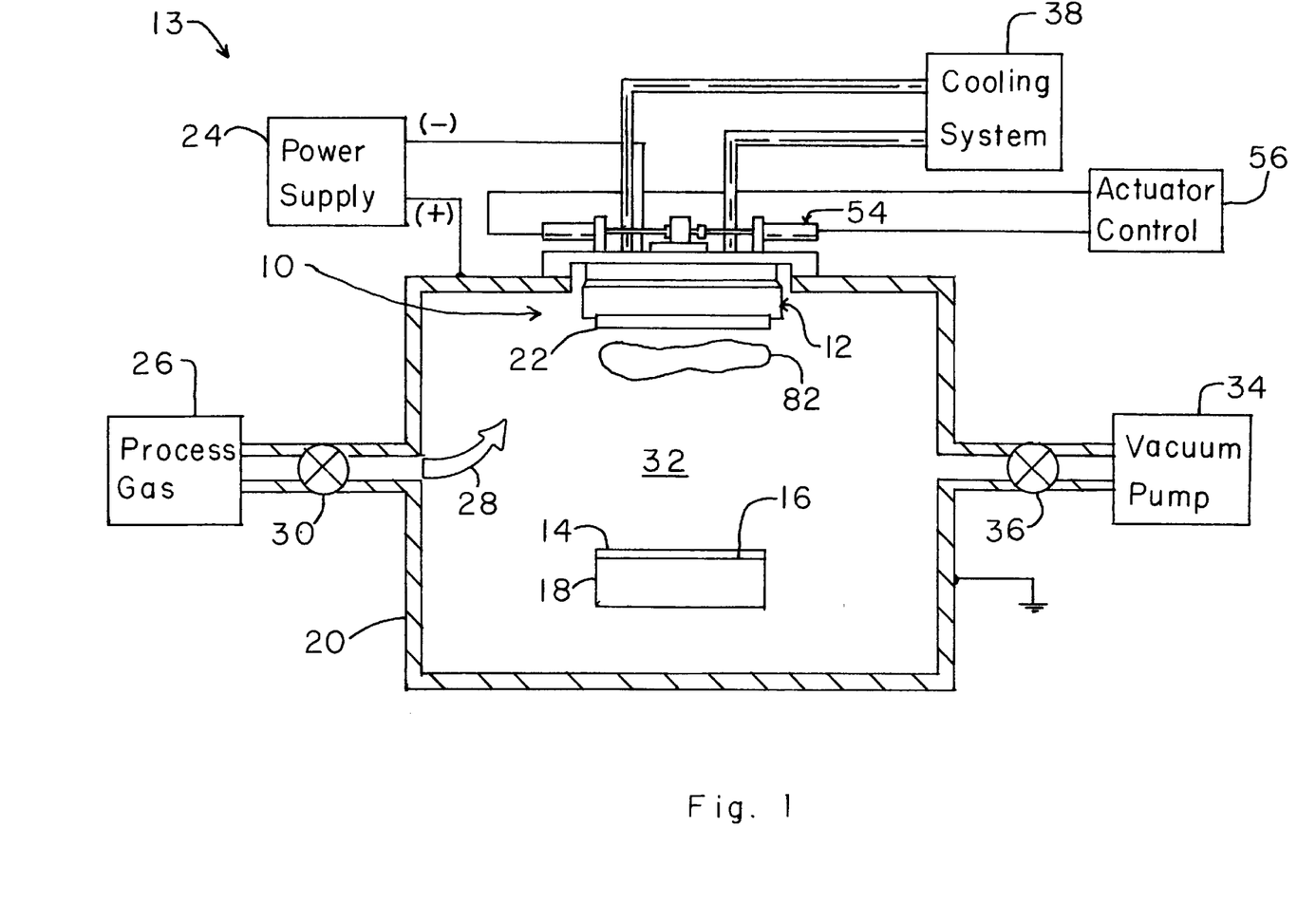
FIG. 1 is a schematic representation of one embodiment of a film deposition apparatus utilizing a magnet assembly according to the present invention.

One embodiment of a magnet assembly 10 according to the present invention is shown in FIG. 1 as it could comprise a portion of a magnetron assembly 12 of the type commonly used to perform plasma deposition processes. For example, the magnetron assembly 12 may be utilized in a film deposition apparatus 13 to deposit a film 14 onto a surface 16 of a substrate 18 contained within a vacuum chamber 20. The material comprising the film 14 may be derived by sputtering a target 22 associated with the magnetron assembly 12. The magnet assembly 10 produces a plasma confining magnetic tunnel 44 (FIG. 5) over the front side 42 of the target 22 and includes a moveable magnet plate 48 (FIG. 2) and an actuator system 54 which changes the configuration of the plasma confining magnetic tunnel 44. The changeable configuration of the plasma confining magnetic tunnel 44 increases the erosion of the center region 80 of the target material 22, as best seen in FIG. 2.

Figure 2:
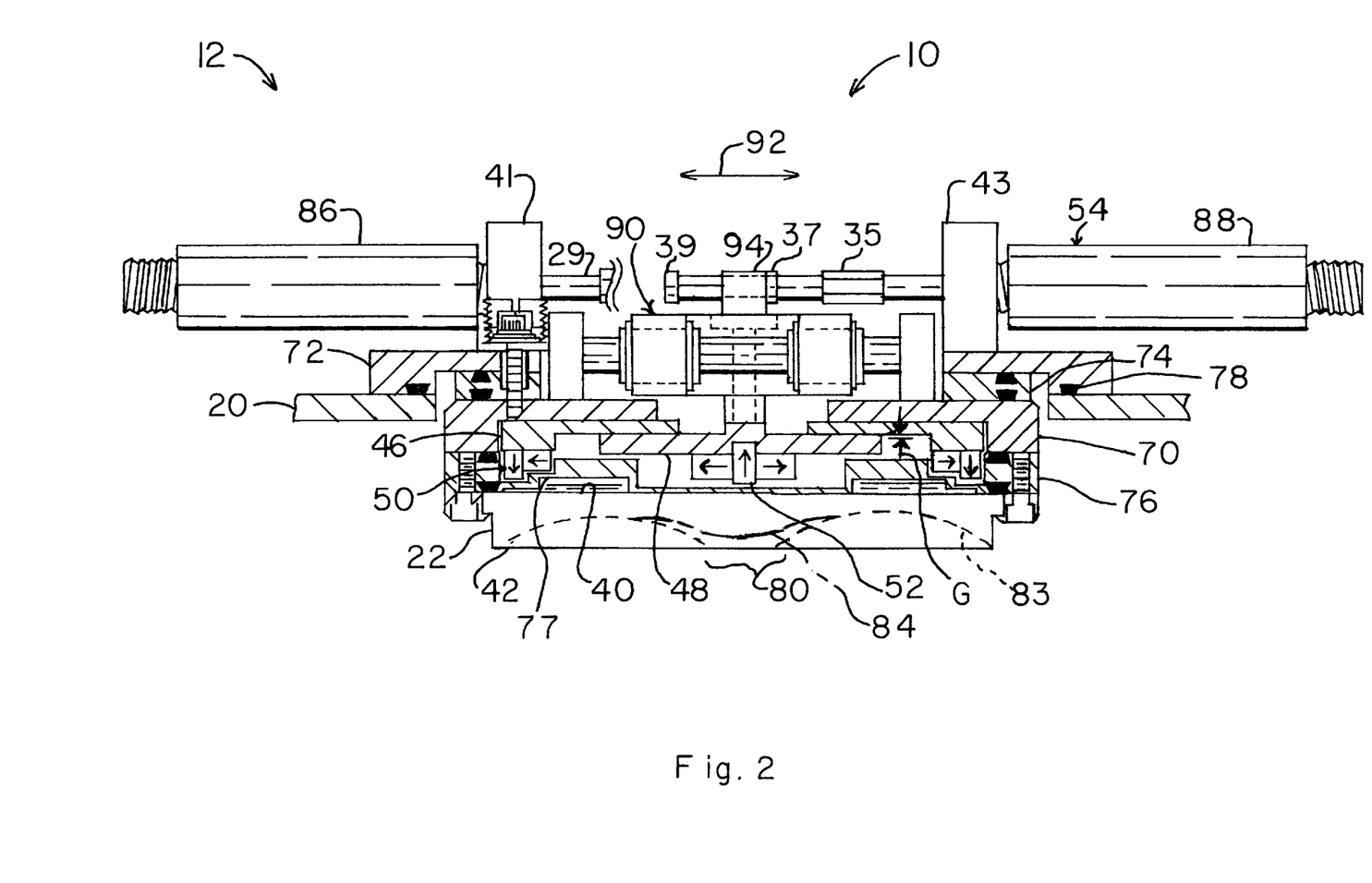
FIG. 2 is a cross-section view in elevation of the magnet assembly shown in FIG. 1 with the moveable magnet plate located in the center position.
Figure 4:
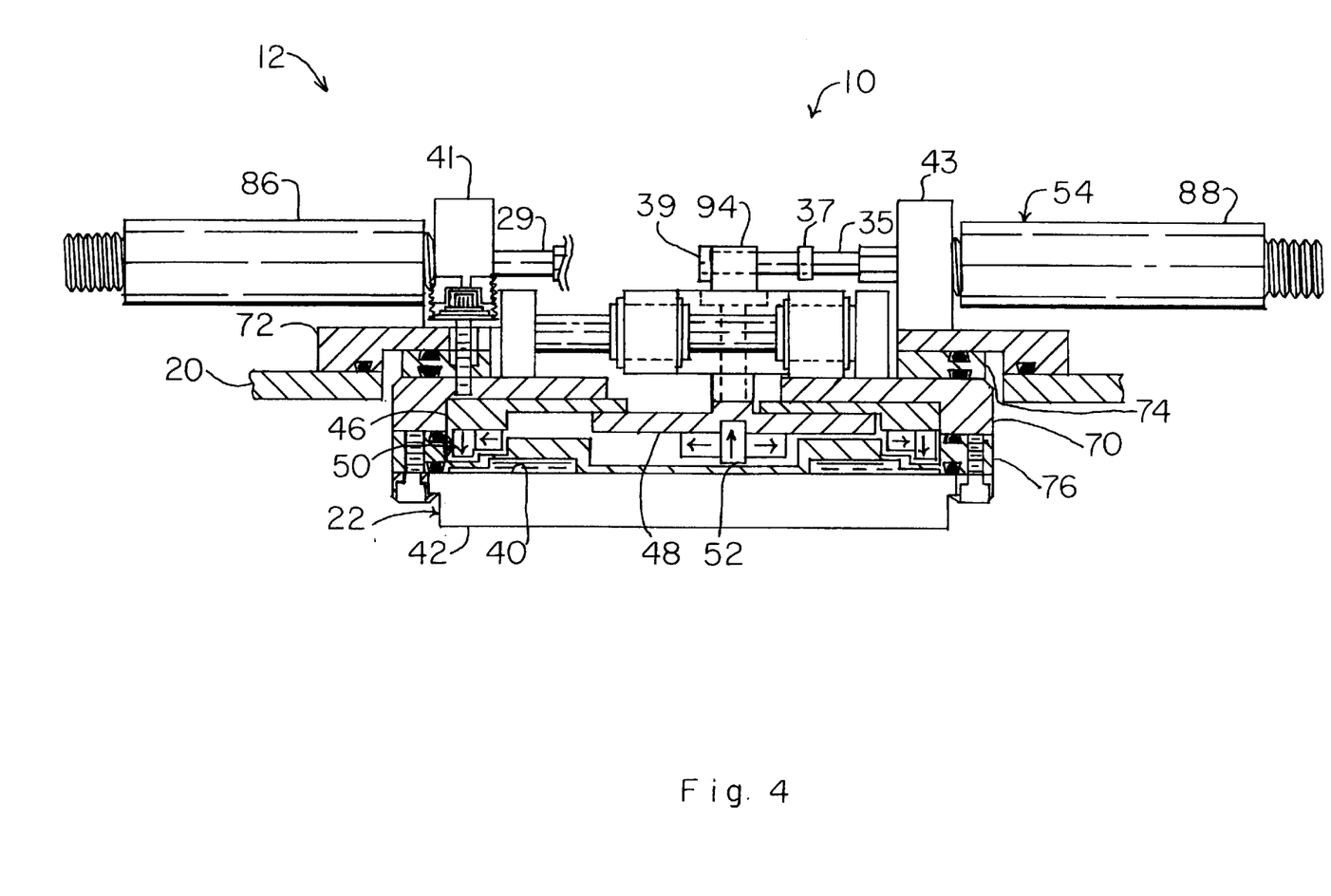
FIG. 4 is a cross-section view in elevation of the magnet assembly shown in FIG. 2, but with the moveable magnet plate located at a right-most end position.
Figure 5:
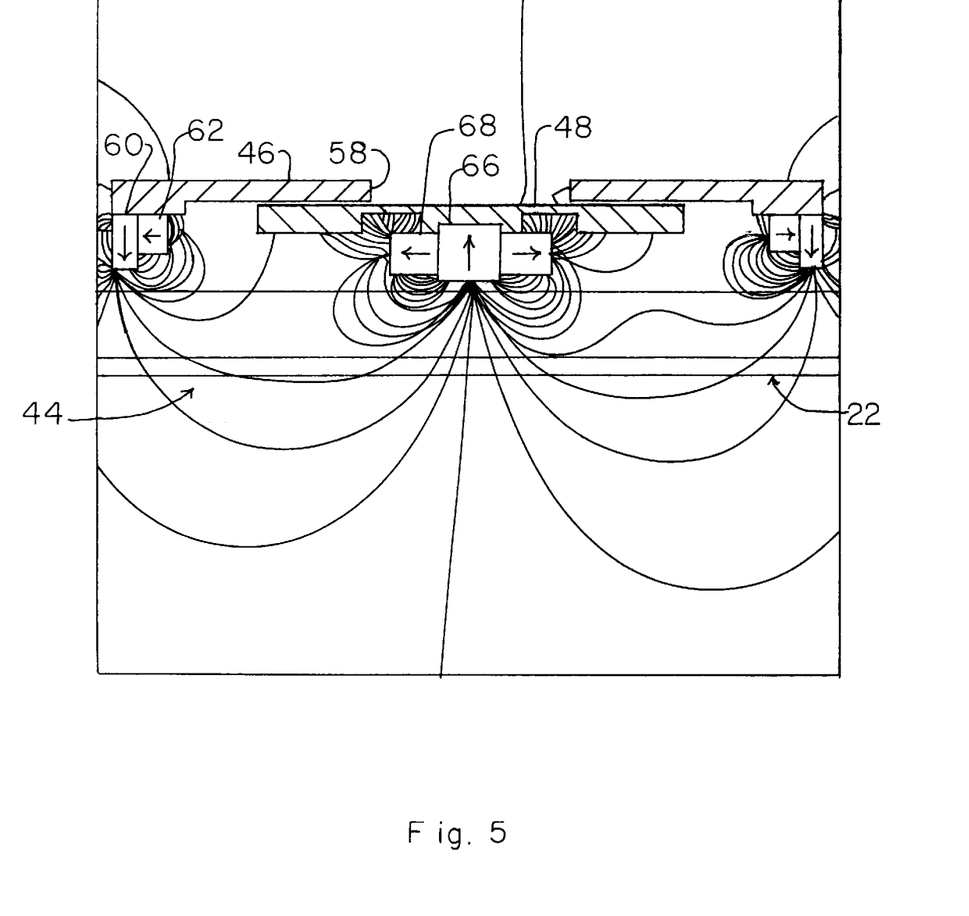
FIG. 5 is a schematic cross-section view in elevation of the magnet assembly showing the orientation of the magnetic flux lines with the moveable magnet plate located at the center position.

Referring now primarily to FIGS. 2 and 4, the magnet assembly 10 may be positioned adjacent the back side 40 of target 22 and may include a first or stationary magnet plate 46 and a second or moveable magnet plate 48. The stationary magnet plate 46 may be provided with at least one, and preferably a plurality, of outer or stationary plate magnets 50, whereas the moveable magnet plate 48 may be provided with at least one, and preferably a plurality, of inner or moveable plate magnets 52. See also FIG. 10. The stationary and moveable plate magnets 50 and 52 may be configured to produce the plasma-confining magnetic field 44 having a configuration substantially as shown in FIG. 5 when the moveable magnet plate 48 is located at the center position. The configuration of the plasma confining magnetic field changes somewhat when the moveable magnet plate 48 is located at either of the end positions. For example, when the moveable magnet plate 48 is located at the left-most end position, the magnets 50 and 52 produce a modified plasma-confining magnetic field 44' as shown in FIG. 6.

The actuator assembly 54 is used to move the magnet plates 46 and 48 with respect to one another. For example, in the embodiment shown and described herein, the actuator assembly 54 may move the moveable magnet plate 48 from a center position shown in FIG. 2 to a right-most end position shown in FIG. 3 and back again. The actuator assembly 54 may also move the moveable magnet plate 48 from the center position shown in FIG. 2 to a left-most end position (e.g., shown in FIG. 6) and back again. The left-most end position is substantially symmetrical to the right-most position.

Figure 3:
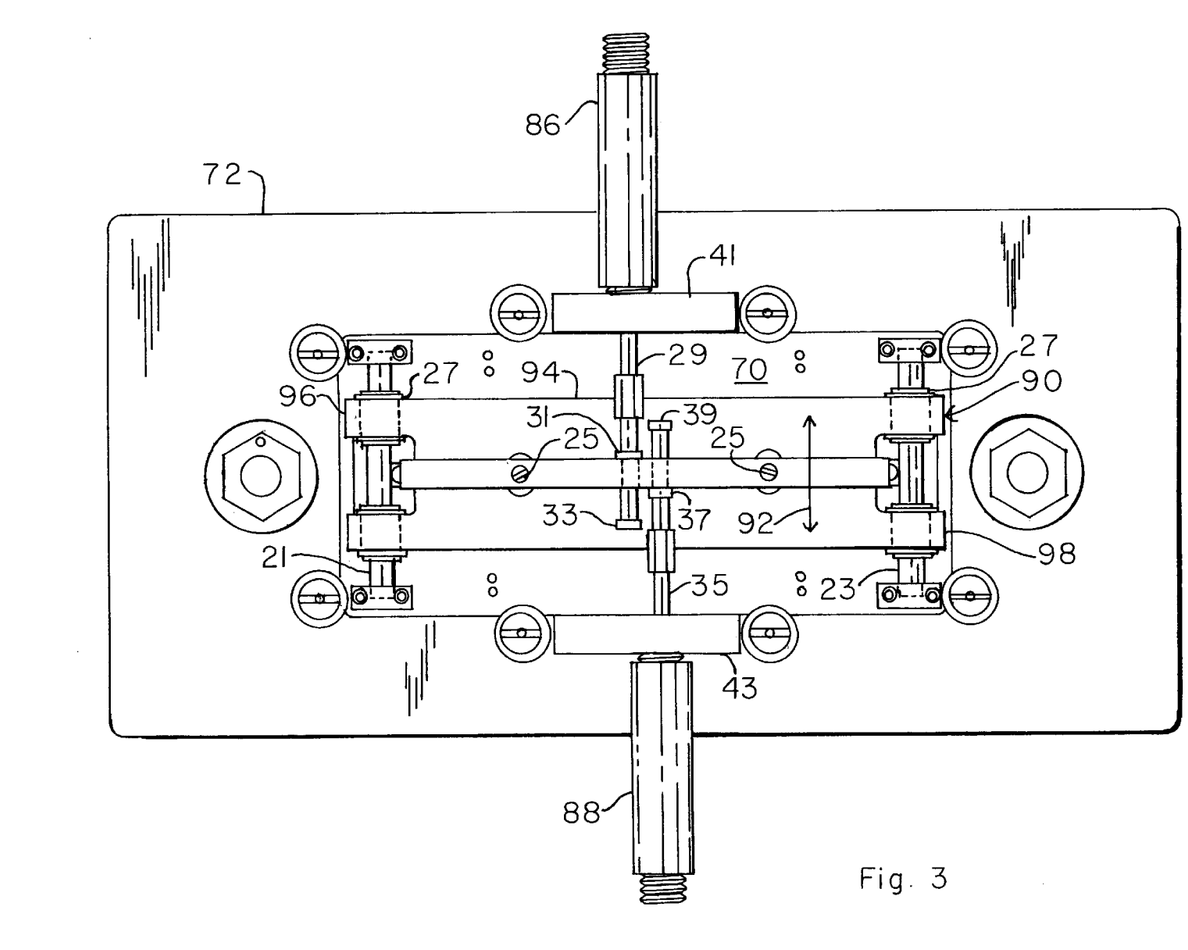
FIG. 3 is a plan view of the magnet assembly shown in FIG. 2.
Figure 6:
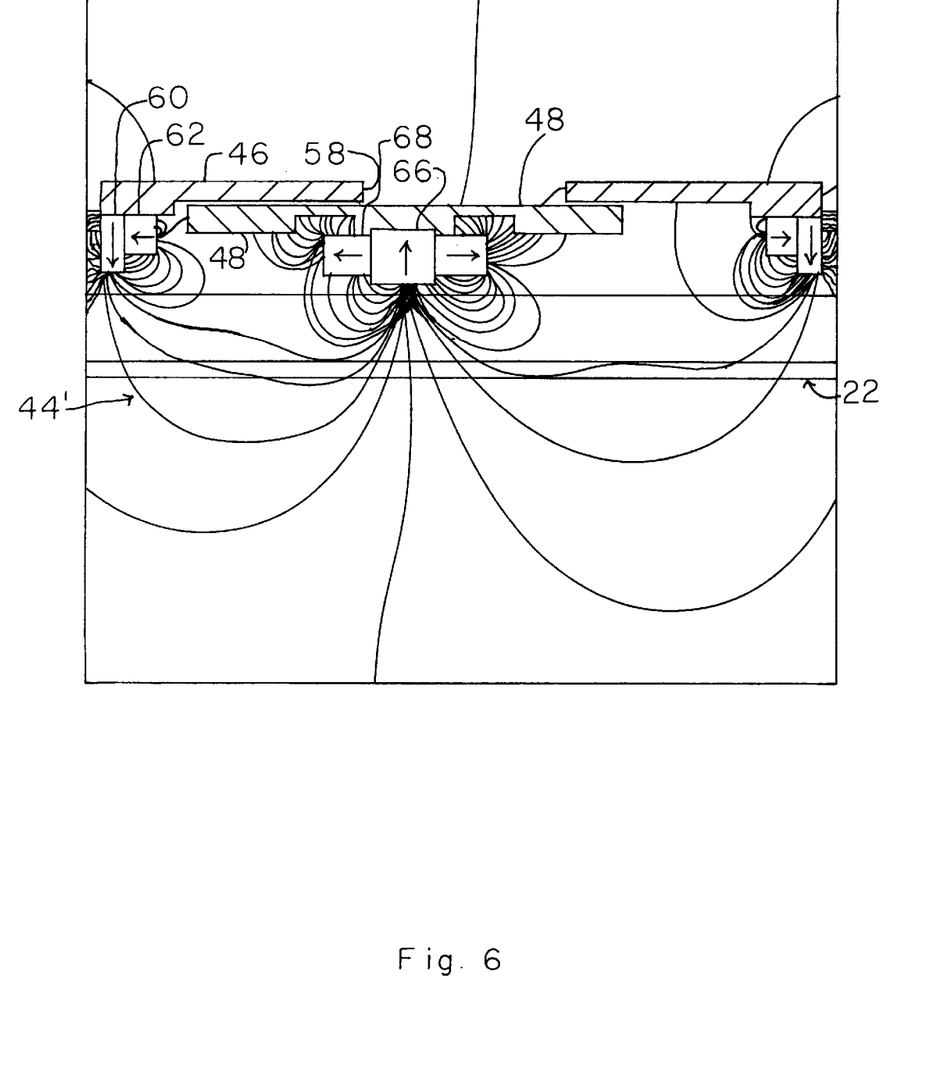
FIG. 6 is a schematic cross-section view in elevation of the magnet assembly showing the orientation of the magnetic flux lines with the moveable magnet plate located at a left-most end position.

A control system 56 operatively associated with the actuator assembly 54 controls the rate at which the moveable magnet plate 48 is displaced from the center position shown in FIG. 2 to either the right-most end position shown in FIG. 3 or the left-most end position shown in FIG. 6. The moveable magnet plate 48 need not be displaced from the center position shown in FIG. 2 for an extended period of time in order to achieve the objects and advantages associated with the present invention. For example, in one preferred embodiment, the moveable magnet plate 48 need only be displaced from the center position for about 25% of the time. That is, the moveable magnet plate 48 may remain in the center position for about 75% of the time.

Referring back now to FIG. 1, the magnetron assembly 12 incorporating the magnet assembly 10 may be used in a film deposition apparatus 13 to accomplish any of a wide range of deposition processes, such as D.C., A.C., or R.F. sputtering, although other types of processes may also be performed. If the magnetron assembly 12 is to be used in a D.C. sputtering process, the magnetron assembly 12 may be connected to a negative (−) terminal of a power supply 24, whereas the vacuum chamber 20 may be connected to a positive (+) terminal of the power supply 24. In such a configuration, the magnetron assembly 12 (specifically the target 22), serves as the cathode, whereas the vacuum chamber 20 serves as the anode.

The vacuum chamber 20 may comprise a generally closed, gas-tight chamber and may be provided with a variety of ancillary systems and devices that may be necessary or desirable in order to perform the desired process. For example, in one preferred embodiment, the vacuum chamber 20 may be provided with a process gas supply 26 which contains a supply of a suitable process gas, such as argon, as indicated by arrow 28. The process gas supply 26 may be connected to the vacuum chamber 20 via a process gas valve 30 which regulates the flow of the process gas 28 into the interior 32 of vacuum chamber 20. The vacuum chamber 20 may also include a vacuum pump assembly 34 and a vacuum valve assembly 36 to maintain the interior 32 of the vacuum chamber 20 at a pressure suitable for carrying out the desired process. A cooling system 38 may also be provided to cool the magnetron assembly 12 and/or the vacuum chamber 20. If a reactive sputtering process is to be performed, the vacuum chamber 20 may also be provided with a supply of a suitable reactive gas (not shown), along with the appropriate devices (e.g., valves, regulators, etc., also not shown) for introducing the appropriate quantity of reactive gas into the vacuum chamber 20.

The magnetron assembly 12 utilizing the magnet assembly 10 according to the present invention may be operated as follows to deposit a thin film 14 of material from the target 22 onto the surface 16 of a substrate 18 positioned within the vacuum chamber 20. Assuming that proper pressure and atmosphere have been established within the interior 32 of vacuum chamber 20, the sputter deposition process may be initiated by activating the power supply 24. Thereafter, the power supply 24 places a negative charge on the magnetron assembly 12 (more specifically the target 22) and a positive charge on the vacuum chamber 20. The resulting electric field (not shown) established between the magnetron assembly 12 and the anode (e.g., vacuum chamber 20) initiates or "ignites" the glow discharge or plasma which is shown schematically in FIG. 1 at 82. The plasma 82 causes sputtering of the target 22 of the magnetron assembly 12. That is, atoms (not shown) sputtered from the target 22 are released into the interior 32 of chamber 20, whereupon a portion of the sputtered atoms subsequently condense on the surface 16 of substrate 18, thereby forming the film 14.

During the operation of the plasma process the actuator control system 56 operates the actuator system 54 to move the moveable magnet plate 48 from the center position (shown in FIG. 2) to the right-most end position (shown in FIG. 4) and to the left-most end position (shown in FIG. 6). More specifically, in one preferred embodiment, the actuator system 54 moves the moveable magnet plate 48 in an alternating manner between the center position and the right-most end position and back again, then from the center position to the left-most end position and back again. As was briefly mentioned above, the actuator system 54 need only displace the moveable magnet plate 48 from the center position for about 25% of the total process time. Put in other words, the moveable magnet plate 48 may be located at about the center position for about 75% of the total process time.

The movement of the moveable magnet plate 48 changes the shape or configuration of the plasma confining magnetic field from the shape or configuration 44 shown in FIG. 5 when the moveable magnet plate 48 is located at about the center position to the shape or configuration 44' shown in FIG. 6 when the moveable magnet plate 48 is located at the left-most end position. The shape or configuration of the plasma confining magnetic field when the moveable magnet plate 48 is in the right-most end position is substantially symmetrical to the configuration shown in FIG. 6. The changes in the configuration of the plasma confining magnetic field are such that the erosion of the center region 80 of the target 22 is increased when the moveable magnet plate 48 is displaced from the center position shown in FIG. 2. As a result, the erosion profile of the target 22 is effectively altered from the "standard" erosion profile 83 illustrated in FIG. 2, which would be the result if the moveable magnet plate 48 were maintained in the center position, to the "enhanced" erosion profile 84 which is the result when the moveable magnet plate 48 is moved back and forth between the center position and the right and left-most end positions, as described above.

A significant advantage of the magnet assembly 10 according to the present invention is that it increases overall target utilization by increasing the erosion of the normally lightly eroded center region 80 of the target 22. The increased erosion of the center region 80 of the target 22 continually "cleans" (e.g., by sputtering) the center region 80 of the target 22, thereby minimizing the likelihood that the target 22 will become "poisoned" due to the re-deposition of material onto the center region 80 of the target 22. Such poisoning of the target material 22 can be a significant problem in certain types of processes (e.g., reactive sputtering processes) and may increase the likelihood of arcing. Poisoned regions on the target 22 may also reduce the overall sputtering rate of the target which can complicate process control or otherwise adversely affect the coating process.

Having briefly described the magnet assembly 10 according to the present invention, as well as some of its more significant features and advantages, the preferred embodiments of the magnet assembly 10 will now be described in detail. However, before proceeding with the description, it should be noted that while the magnet assembly 10 is shown and described herein as it may be used in a magnetron 12 and film deposition apparatus 13 to perform D.C. sputter deposition, the magnet assembly 10 is not limited to use with any particular type or style of magnetron 12 or any particular type or style of film deposition apparatus 13. Indeed, the magnet assembly 10 may be used in any of a wide variety of magnetrons and film deposition systems to accomplish any of a wide variety of film deposition processes. Consequently, the present invention should not be regarded as limited to the particular applications and processes shown and described herein.

With the foregoing considerations in mind, one preferred embodiment of a magnet assembly 10 is shown in FIG. 1 as it may be used in a magnetron assembly 12 to produce a plasma-confining magnetic field 44 (FIG. 5) over the front side 42 of a target 22 associated with the magnetron assembly 12. The magnetron assembly 12 may then be used in a film deposition apparatus 13 to deposit a film 14 onto the surface 16 of a substrate 18 contained within a vacuum or process chamber 20. By way of example, in one preferred embodiment, the film deposition apparatus 13 may be utilized in a non-reactive, D.C. sputter deposition process. Alternatively, the magnetron apparatus 12 utilizing the magnet assembly 10 could be used to perform other types of processes. Accordingly, as used herein, the term "film deposition apparatus" refers to apparatus that includes a process chamber (e.g., vacuum chamber 20), a material source (e.g., a magnetron 12), an anode (e.g., vacuum chamber 20), as well as any associated systems and devices (e.g., process gas supply 26, vacuum pumping system 34, etc.) required to perform the desired process.

In accordance with its use for accomplishing nonreactive sputter deposition, the process or vacuum chamber 20 utilized in one preferred embodiment may include a process gas supply 26 which contains a supply of a suitable process gas (indicated by arrow 28), such as argon, although other gases may also be used. A process gas valve 30 connected between the process gas supply 26 and the vacuum chamber 20 may be used to control the flow of the process gas 28 into the interior 32 of chamber 20. Vacuum chamber 20 may also include a vacuum pumping system 34 and a vacuum valve assembly 36 to maintain the interior region 32 of the vacuum chamber 20 at a pressure suitable for carrying out the desired process. For example, in most magnetron sputter deposition processes it is usually desirable to maintain the interior 32 of the process chamber 20 at or below a pressure of about 1 milliTorr (mTorr), although other pressures could also be used depending on the type of process being performed and on other extrinsic factors.

It should be noted that process chambers (e.g., vacuum chamber 20), as well as the various ancillary devices and systems (e.g., process gas supply systems, pumping systems, etc.) associated therewith are well-known in the art and could be easily provided by persons having ordinary skill in the art after having become familiar with the teachings of the present invention. Therefore, the particular process chamber 20 and related ancillary systems and devices utilized in one preferred embodiment of the invention will not be described in further detail.

If it is desired to configure the film deposition apparatus 13 to accomplish reactive sputter deposition, the process chamber 20 may also be provided with a reactant gas source (not shown) that contains a supply of a suitable reactant gas. Examples of suitable reactant gases include, but are not limited to, oxygen ($O_2$), nitrogen ($N_2$), and hydrogen sulfide ($H_2S$). The reactant gas source (not shown) may also include a valve assembly (also not shown) to regulate the flow of the reactant gas into the interior 32 of process chamber 20. However, since such additional systems and devices required to accomplish reactive sputter deposition are also well-known in the art and could be easily provided by persons having ordinary skill in the art after having become familiar with the present invention, the additional systems and devices that may be required or desired to accomplish reactive sputter deposition also will not be described in further detail herein.

Figure 7:
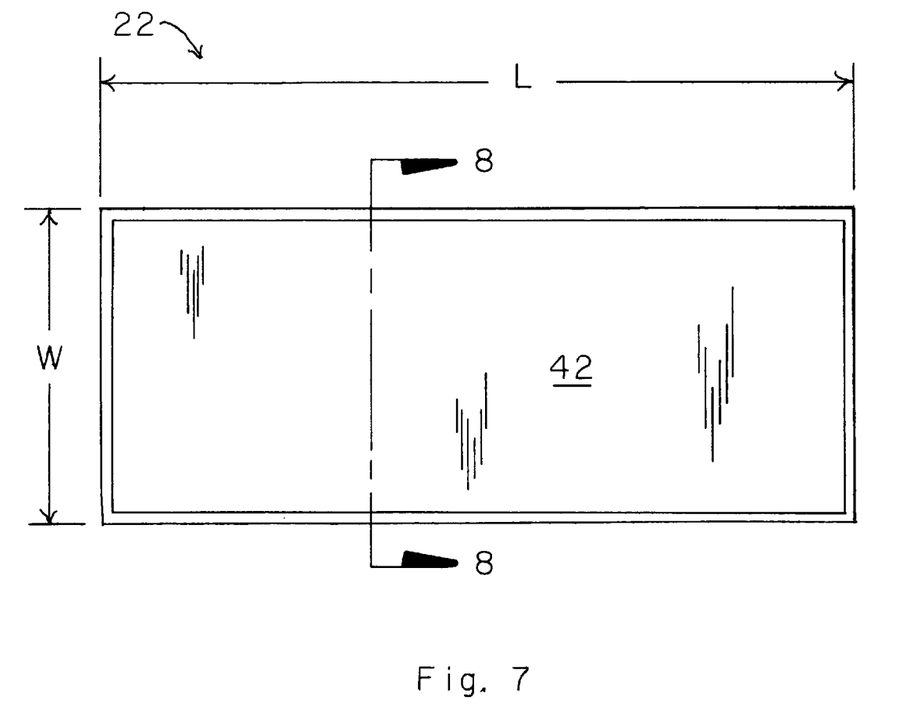
FIG. 7 is a plan view of a rectangular target.
Figure 8:
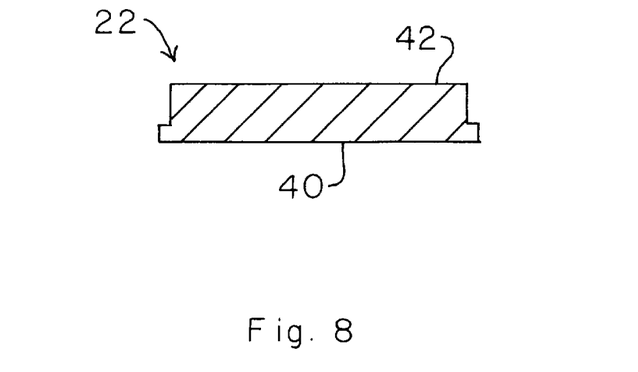
FIG. 8 is a cross-section view in elevation of the rectangular target taken along the line 8—8 of FIG. 7.
Figure 9:
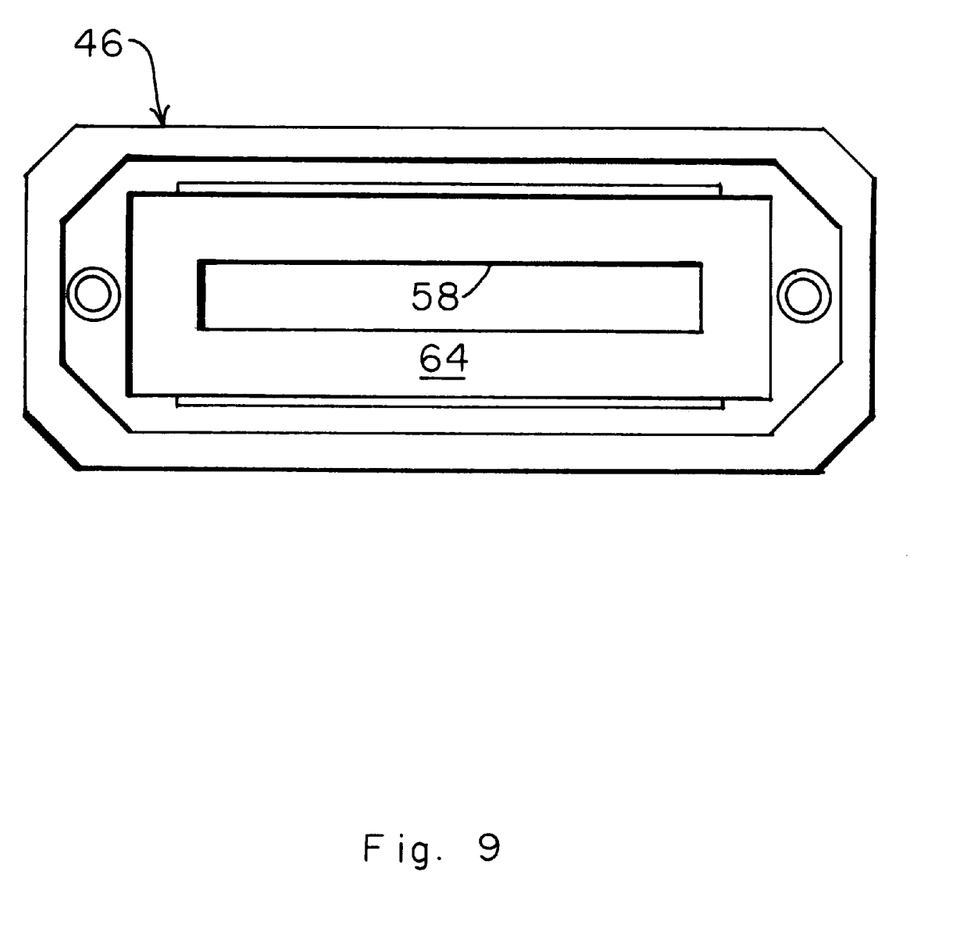
FIG. 9 is a plan view of the stationary magnet plate showing some of the magnets positioned thereon.
Figure 10:
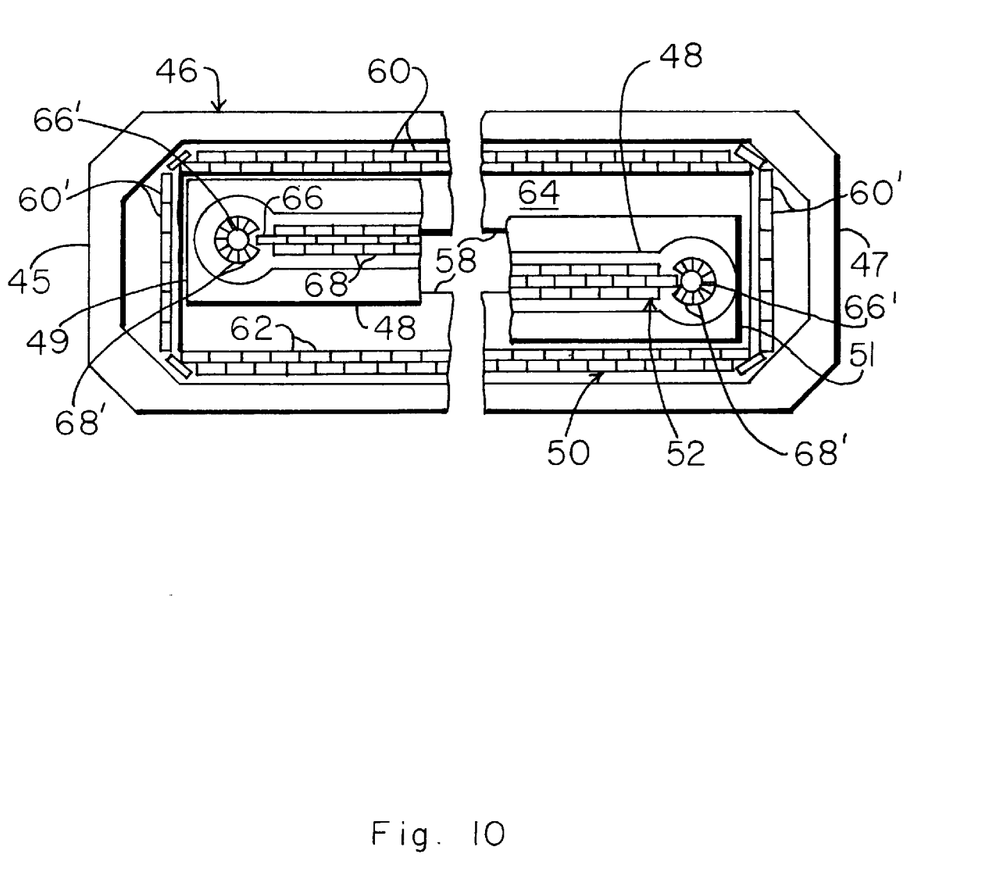
FIG. 10 is plan view of magnet assembly with the moveable magnet plate shown in both the right-most and left-most end positions.

The magnetron assembly 12 utilized in one preferred embodiment of the present invention may include the magnet assembly 10, the target 22, as well as various other systems and apparatus that will be described in greater detail below. As was briefly mentioned above, the magnet assembly 10 produces the plasma confining magnetic field 44 over the front side 42 of the target 22. In accordance with this function, the magnet assembly 10 will have an overall configuration that is dictated at least in part by the overall configuration of the target 22. For example, in the embodiment shown and described herein, the target 22 may comprise a plate-like member having a generally rectangular configuration with a length L and a width W, as best seen in FIG. 7. Accordingly, the magnet assembly 10 may also provided with a generally rectangular shape or configuration, as best seen in FIGS. 9 and 10.

Proceeding now with the description, one embodiment of the magnetron assembly 12 may comprise a generally rectangular configuration suitable for eroding a target 22 having a generally rectangular shape with a length L and a width W, as best seen in FIG. 7. The length L and width W of the target 22 may be any convenient size depending on the particular application. Consequently, the present invention should not be regarded as limited to targets having any particular size. However, by way of example, the target 22 utilized in one preferred embodiment may have a length L of about 15 inches and a width W of about 6 inches.

The target 22 may be made from any of a wide range of materials depending on the type of film that is to be deposited on the surface 16 of substrate 18. Therefore, the present invention should not be regarded as limited to any particular target material. By way of example, in one preferred embodiment, the target 22 comprises aluminum.

The magnet assembly 10 may be positioned adjacent the back side 40 of the target 22 and produces the plasma-confining magnetic tunnel 44 adjacent the front side 42 of target 22. See FIG. 5. It is generally preferred that the plasma confining magnetic field have a configuration substantially as described in U.S. Pat. No. 5,262,028, which is specifically incorporated herein by reference for all that it discloses. As is described in the foregoing patent, several different magnet configurations may be used to produce the plasma confining magnetic field, and the magnet assembly 10 according to the present invention may utilize any such magnet configuration. However, for the purposes of providing a detailed description of an exemplary embodiment of the present invention, one particular magnet configuration suitable for producing the plasma confining magnetic field will now be described in detail.

Referring now primarily to FIGS. 2, 4, 9, and 10, the magnet assembly 10 may comprise a stationary magnet plate 46 and a moveable magnet plate 48. The stationary magnet plate 46 may comprise a generally rectangularly shaped member having a central aperture 58 therein. The stationary magnet plate 46 may also be provided with a recessed portion 64 sized to receive the moveable magnet plate 48. The arrangement of the stationary magnet plate 46 and moveable magnet plate 48 is such that a gap G exists between the recessed portion 64 of the stationary plate 46 and the moveable plate 48. It is generally preferred that the gap G be made as small as possible to ensure good magnetic coupling between the stationary and moveable magnet plates 46 and 48. By way of example, in one preferred embodiment, the gap G between the stationary and moveable magnet plates 46 and 48 may be in the range of about 0.01 inches to about 0.1 inches (0.02 inches preferred).

The stationary magnet plate 46 supports a plurality of stationary plate magnets 50. Specifically, stationary magnet plate 46 may support a plurality of outer magnets 60 as well as a plurality of intermediate magnets 62. See FIG. 10. The outer magnets 60 and intermediate magnets 62 may be positioned in abutting relation, as best seen in FIG. 2. Each magnet has a north and south pole that are generally aligned along a pole axis. The pole axis is schematically represented in the various drawing figures as an arrow, with the "head" portion of the arrow pointing toward the north pole of the magnet. Accordingly, the outer magnets 60 are generally "vertically" oriented so that the pole axis of each of the outer magnets 60 is generally perpendicular to the stationary magnet plate 46. Each outer magnet 60 may have the polarity indicated in FIG. 5 (i.e., with the north poles indicated by the "head" portions of the arrows located away from the stationary magnet plate 46). The intermediate magnets 62 may be positioned adjacent the outer magnets 60 and may have their north and south poles oriented generally "horizontally" (i.e., so that the pole axis of each intermediate magnets 62 is generally parallel to the stationary magnet plate 46). Each intermediate magnet 62 may have the polarity indicated in FIG. 5, i.e., with the north pole located adjacent the outer magnet 60. Alternatively, the various stationary plate magnets 60 and 62 may be positioned on the stationary magnet plate 46 so that they have opposite polarities.

If the magnet assembly 10 comprises a generally rectangular configuration suitable for use with a rectangular target 22 (FIG. 7), then each end section 45, 47 of the stationary magnet plate 46 may be provided with a plurality of outer magnets 60', as best seen in FIG. 10. The intermediate magnets 62 may be omitted from each end section 45, 47. The orientations and polarities of the end section outer magnets 60' are the same as for the outer magnets 60 referred to above.

The moveable magnet plate 48 may comprise a generally rectangularly shaped member sized to be received within the recess 64 provided in the stationary magnet plate 46, as best seen in FIGS. 2, 4, and 10 and supports a plurality of moveable plate magnets 52. More specifically, the moveable magnet plate 48 supports a plurality of central magnets 66 and a plurality of intermediate magnets 68. See FIG. 10. The north and south poles of the central magnets 66 are generally "vertically" oriented (i.e., so that the pole axes of the central magnets 66 are generally perpendicular to the moveable magnet plate 48) and may have the polarities indicated in FIG. 5. The intermediate magnets 68 may be positioned adjacent the central magnets 66 and may have their north and south poles oriented generally "horizontally" (i.e., so that the pole axes of the intermediate magnets 68 are generally parallel to the moveable magnet plate 48) and may have the polarities shown. Alternatively, the various magnets 66 and 68 may be positioned on the moveable magnet plate 48 so that they have opposite polarities.

Referring now primarily to FIG. 10, each end section 49, 51 of the moveable magnet plate 48 may be provided with a plurality of end section magnets arranged in a generally semi-circular configuration. More specifically, each end section 49, 51 may be provided with a central magnet 66' that is partially surrounded by a plurality of intermediate magnets 68'. The polarities and orientations of the end section central magnets 66' may be the same as for the central magnets 66. Similarly, the polarities and orientations of the end section intermediate magnets 68' may be the same as those for the intermediate magnets 68. The semi-circular configuration of the end section magnets 66' and 68' provide the plasma confining magnetic field with curved or semi-circular end sections. Therefore, the "tunnel" defined by the plasma confining magnetic field forms a closed loop circuit or racetrack over the front side 42 of target 22.

It is generally preferred that the both the stationary and moveable magnet plates 46 and 48 comprise a ferromagnetic material, such as magnetic stainless steel. As used herein, the term "ferromagnetic" refers to those metals, alloys, and compounds of the transition (iron group) rare-earth and actinide elements in which the internal magnetic moments spontaneously organize in a common direction, giving rise to a magnetic permeability considerably greater than that of vacuum and to magnetic hysteresis. Ferromagnetic materials may include, without limitation, iron, nickel, cobalt, and various alloys thereof. The magnets 60, 62, 66, and 68 may comprise rare-earth neodymium-iron-boron (NdFeB) magnets having magnetic field energy products of about 35 megagaussoersteds. However, other types of rare earth magnets, such as samarium cobalt (SmCo) magnets, may also be used. Alternatively, various kinds of ceramic magnets, such as barium or strontium ferrite magnets, may also be used, although their magnetic field energy products are generally lower.

The configuration of the plasma confining magnetic field produced by the various magnets 60, 62, 66, and 68 changes as the moveable magnet plate 48 is moved from the center position to the right-most and left-most end positions. For example, in the embodiment shown and described herein, the plasma confining magnetic field has an initial or "center" configuration 44 substantially as shown in FIG. 5 when the moveable magnet plate 48 is located in the center position. Similarly, the plasma confining magnetic field may have a modified or "end" configuration 44' substantially as shown in FIG. 6 when the moveable magnet plate 48 is located at the left-most end position. The shape or configuration of the plasma confining magnetic field when the moveable magnet plate 48 is in the right-most end position is substantially symmetrical to the shape of the field 44' which is shown in FIG. 6.

Referring back now to FIGS. 2–4, the stationary magnet plate 46 may be mounted to a mounting plate 70, which in turn may be affixed to a flange member 72 via an insulator member 74. Flange member 72 may be adapted to mount to the walls of the vacuum or process chamber 20. A cooling plate 76 may be positioned between the mounting plate 70 and the target 22 and may be provided with a plurality of cooling passages 77 through which circulates a coolant (e.g., water) to prevent the magnet assembly 10 and target 22 from overheating. The coolant may be provided by a suitable cooling system 38.

The mounting plate 70 and cooling plate 76 may be made from a non-ferromagnetic material, preferably having good thermal conductivity. For example, in one preferred embodiment, the mounting plate 70 and cooling plate 76 are made from copper, although other materials could also be used. The insulator member 74 may comprise Teflon® or aluminum oxide, although other materials may also be used. The various elements comprising the magnetron assembly 12 may also be provided with a plurality of O-ring type seals 78 to provide a vacuum-tight seal where necessary. Alternatively, other types of sealing devices could also be used.

The moveable magnet plate 48 may be mounted to a sliding carriage assembly 90 which allows the moveable magnet plate 48 to slide back and forth generally in the directions indicated by arrows 92, i.e., from the center position to either of the right-most and left-most end positions. The carriage assembly 90 may include a sliding member 94 having a pair of forked end sections 96 and 98, as best seen in FIG. 3. The first forked end section 96 is slidably mounted to a first linear journal member or rod 21 which may be affixed to the mounting plate 70. Similarly, the second forked end section 98 of sliding member 94 is slidably mounted to a second linear journal member or rod 23 that is also affixed to the mounting plate 70. It is preferred, but not required, that the first and second forked end sections 96 and 98 of sliding member 94 be provided with one or more bearing sleeves 27 to provide a low-friction sliding engagement with each of the rods 21 and 23. Sliding member 94 may be attached to the moveable magnet plate 48 by any convenient fastening device or system, such as by screws 25.

The actuator assembly 54 is used to move the moveable magnet plate 48 from the center position to the right-most and left-most end positions and back again. In one preferred embodiment, the actuator assembly 54 may comprise a pair of pneumatic actuators 86 and 88 that are connected to the carriage assembly 90. Selective actuation of the pneumatic actuators 86 and 88 will cause the actuators 86 and 88 to move the carriage assembly 90, thus moveable magnet plate 46, from the center position illustrated in FIG. 2 to the right-most and left-most end positions illustrated in FIGS. 4 and 6, respectively.

The first and second pneumatic actuators 86 and 88 may be mounted to respective mounting brackets 41 and 43 provided on the flange member 72 so that the actuators 86 and 88 are located in substantially opposed relation. See FIG. 3. The first actuator 86 may be connected to the sliding member 94 by a first actuator rod 29. The first actuator rod 29 may be provided with a pair of shoulder members 31 and 33 positioned in spaced-apart relation so that the actuator rod 29 and sliding member 94 are free to move relative to one another between the shoulder members 31 and 33. The second actuator 88 is connected to the sliding member 94 in a similar manner. That is, the actuator rod 35 of the second actuator 88 is provided with a pair of shoulders 37 and 39 and is mounted to the sliding member 94 so that the actuator rod 35 and sliding member 94 are free to move relative to one another between the shoulder members 37 and 39.

Each actuator 86 and 88 may comprise a double acting pneumatic actuator that can be extended and retracted by connecting a source of pressurized gas (e.g., air) to the appropriate port (not shown) on each actuator. The two double acting actuators 86, 88, in combination with the sliding engagement with the sliding member 94 provided by the actuator rods 29 and 35, allows the actuators 86 and 88 to be operated to move the moveable magnet plate 48 from the center position (shown in FIGS. 2 and 3) to either the right-most end position (shown in FIG. 4) or the left-most end position (shown in FIG. 6), and back to the center position.

An actuator control system 56 (FIG. 1) operates the actuators 86 and 88 to accomplish the above-described motion. In one preferred embodiment, the actuator control system 56 may comprise a valve network (not shown) to provide pressurized fluid (e.g., air) to the actuators 86 and 88 as necessary to accomplish the desired movement of the moveable magnet plate 48. However, since such control systems are well-known in the art and could be easily provided by persons having ordinary skill in the art after having become familiar with the teachings of the present invention, the particular actuator control system 56 utilized in one preferred embodiment of the present invention will not be described in further detail.

The actuator control system 56 may be operated in accordance with any of a wide range of control schedules to accomplish movement of the moveable magnet plate 48. In one preferred embodiment, the control schedule is such that the actuator control system 54 maintains the moveable magnet plate 48 at the center position for a time that is greater than the times when the magnet plate 48 is located at either of the end positions. While the ratio of times (i.e., the ratio between the time during which the moveable magnet plate 48 is located at the center position and the time during which the moveable magnet plate 48 is located at either the right-most or left-most end positions) may vary, it is preferred that the control schedule be such that the moveable magnet plate 48 is located at the center position for about 75% of the process time. The moveable magnet plate 48 will then be located at either of the right-most or left-most end positions for the remaining 25% of the process time. Put in other words, the time ratio may be about 3:1.

As an example of achieving the foregoing control schedule, the control system 56 may be operated so that it maintains the moveable magnet plate 48 in the center position for a center dwell time ranging between about 1 second to about 30 seconds (12 seconds preferred). After the center dwell time has expired, the control system 56 operates the actuators 86 and 88 as necessary to move the moveable magnet plate 48 to the right-most end position shown in FIG. 4. The control system 56 maintains the moveable magnet plate 48 at the right-most end position for a right dwell time ranging between about 0.5 seconds to about 5 seconds (2 seconds preferred). At the conclusion of the right dwell time, the actuator control system 56 returns the moveable magnet plate 48 to the center position shown in FIG. 2, whereupon it remains for the center dwell time already specified. Once the center dwell time has expired, the control system 54 operates the actuators 86 and 88 to move the moveable magnet plate to the left-most end position shown in FIG. 6. The control system 56 maintains the moveable magnet plate at the left-most end position for a left dwell time ranging between about 0.5 seconds to about 5 seconds (2 seconds preferred). Thereafter, the actuator control system 54 operates the actuators 86 and 88 as necessary to return the moveable magnet plate 48 to the center position and the cycle repeats.

The magnetron assembly 12 utilizing the magnet assembly 10 according to the present invention may be operated as follows to deposit a thin film 14 of material from the target 22 onto the surface 16 of a substrate 18 positioned within the vacuum chamber 20. Assuming that proper pressure and atmosphere have been established within the interior 32 of vacuum chamber 20, the sputter deposition process may be initiated by activating the power supply 24. Thereafter, the power supply 24 places a negative charge on the magnetron assembly 12 and a positive charge on the vacuum chamber 20. By way of example, the power supply 24 may comprise a power supply of the type shown and described in U.S. Pat. No. 5,682,067, entitled "Circuit for Reversing Polarity on Electrodes," which is specifically incorporated herein by reference for all that it discloses. The electric field (not shown) established between the magnetron assembly 12 and the anode (e.g., vacuum chamber 20) initiates the glow discharge or plasma 82. The plasma 82 causes sputtering of the target 22 of the magnetron assembly 12. That is, atoms (not shown) sputtered from the target 22 are released into the interior 32 of chamber 20, whereupon a portion of the sputtered atoms subsequently condense on the surface 16 of substrate 18, thereby forming the film 14.

During operation, the actuator control system 56 operates the actuator system 54 according to the control schedule described above to move the moveable magnet plate 48 in an alternating manner between the center position and the right-most end position and back again, then from the center position to the left-most end position and back again.

The movement of the moveable magnet plate 48 changes the shape or configuration of the plasma confining magnetic field from the shape or configuration 44 shown in FIG. 5 when the moveable magnet plate 48 is located at about the center position to the shape or configuration 44' shown in FIG. 6 when the moveable magnet plate 48 is located at the left-most end position. The shape or configuration of the plasma confining magnetic field when the moveable magnet plate 48 is in the right-most end position is substantially symmetrical to the configuration shown in FIG. 6. The changes in the configuration of the plasma confining magnetic field are such that the erosion of the center region 80 of the target 22 is increased when the moveable magnet plate 48 is displaced from the center position shown in FIG. 2. As a result, the erosion profile of the target 22 is effectively altered from the "standard" erosion profile 83 illustrated in FIG. 2, which would be the result if the moveable magnet plate 48 were maintained in the center position, to the "enhanced" erosion profile 84 which is the result when the moveable magnet plate 48 is moved back and forth between the center position and the right and left-most end positions.

It is contemplated that the inventive concepts herein described may be variously otherwise embodied and it is intended that the appended claims be construed to include alternative embodiments of the invention except insofar as limited by the prior art.

What is claimed is:

1. A magnet assembly for producing a plasma-confining magnetic field over the surface of a target, comprising:

a first magnet plate having a first magnet mounted thereon so that a pole axis of the first magnet is substantially perpendicular to said first magnet plate;

a second magnet plate having a second magnet mounted thereon and a third magnet mounted thereon at a position adjacent the second magnet so that a pole axis of the second magnet is substantially perpendicular to said second magnet plate and so that a pole axis of the third magnet is substantially parallel to said second magnet plate, said second magnet plate being positioned adjacent said first magnet plate so that the plasma-confining magnetic field is located between the first, second, and third magnets, said first and second magnet plates being moveable between a center position configuration and an end position configuration; and an actuator operatively associated with said first and second magnet plates for moving said first and second magnet plates with respect to one another so that said first and second magnet plates are located at about the center position configuration for a time that is greater than a time that said first and second magnet plates are located at about the end position configuration.

2. The magnet assembly of claim 1, wherein said first magnet plate includes a fourth magnet mounted in spaced apart relation to the first magnet so that a pole axis of the fourth magnet is substantially perpendicular to said first magnet plate and so that the second and third magnets on said second magnet plate are located between the first and fourth magnets on said first magnet plate.

3. The magnet assembly of claim 2, wherein said actuator moves said second magnet plate with respect to said first magnet plate.

4. The magnet assembly of claim 1, wherein the time that said first and second magnet plates are located at about the center position configuration is about three times longer than the time when said first and second magnet plates are located at about the end position configuration.

5. The magnet assembly of claim 1, wherein said actuator includes a pneumatic actuator operatively associated with said second magnet plate so that said pneumatic actuator may move said second magnet plate with respect to said first magnet plate.

6. The magnet assembly of claim 5, further comprising a mounting plate positioned adjacent said first magnet plate, wherein said first magnet plate is fixedly mounted to said mounting plate and wherein said second magnet plate is slidably mounted to said mounting plate.

7. The magnet assembly of claim 6, further comprising a first linear journal and a second linear journal mounted to said mounting plate in spaced-apart relation and wherein said second magnet plate includes a first bearing adapted to engage said first linear journal and a second bearing adapted to engage said second linear journal.

8. The magnet assembly of claim 7, wherein said actuator includes an actuator control system for operating the actuator to move said second magnet plate from the center position configuration to a first end position configuration and from the center position configuration to a second end position configuration.

9. A magnet assembly for producing a plasma-confining magnetic field over the surface of a target, comprising:

a stationary magnet plate having a first magnet mounted thereon so that a first pole axis of the first magnet is substantially perpendicular to said stationary magnet plate;

a moveable magnet plate having a second magnet mounted thereon and a third magnet mounted thereon at a position adjacent the second magnet so that a pole axis of the second magnet is substantially perpendicular to said moveable magnet plate and so that a pole axis of the third magnet is substantially parallel to said moveable magnet plate, said moveable magnet plate being positioned adjacent said stationary magnet plate so that the plasma-confining magnetic field is established between the first, second, and third magnets, said moveable magnet plate being moveable between a center position and an end position; and an actuator operatively associated with said moveable magnet plate for moving said moveable magnet plate with respect to said stationary magnet plate so that said moveable magnet plate is located at about the center position for a time that is greater than a time when said moveable magnet plate is located at about the end position.

10. The magnet assembly of claim 9, wherein the time that said moveable magnet plate is located at about the center position is about three times longer than the time when said moveable magnet plate is located at about the end position.

11. The magnet assembly of claim 9, wherein said stationary magnet plate includes a fourth magnet positioned in spaced apart relation to the first magnet so that a pole axis of the fourth magnet is substantially perpendicular to said stationary magnet plate and so that the second and third magnets on said moveable plate are located between the first and fourth magnets on said stationary plate.

12. The magnet assembly of claim 11, further comprising a mounting plate positioned adjacent said stationary magnet plate, wherein said stationary magnet plate is fixedly mounted to said mounting plate and wherein said moveable magnet plate is slidably mounted to said mounting plate.

13. The magnet assembly of claim 12, further comprising a first linear journal and a second linear journal mounted to said mounting plate in spaced-apart relation and wherein said moveable magnet plate is slidably engaged with said first and second linear journals.

14. The magnet assembly of claim 13, wherein said actuator includes an actuator control system for operating the actuator to move said moveable magnet plate from the center position to a first end position and from the center position to a second end position.

15. A magnet assembly for producing a plasma-confining magnetic field over the surface of a target, comprising:

a stationary magnet plate having a first magnet mounted thereon;

a moveable magnet plate having a second magnet mounted thereon and a third magnet mounted thereon at a position adjacent the second magnet so that a pole axis of the second magnet is substantially perpendicular to a pole axis of the third magnet, said moveable magnet plate being moveable with respect to said stationary plate so that the second and third magnets on said moveable plate move toward the first magnet on the stationary magnet plate when said moveable magnet plate is moving in a first direction and so that the second and third magnets on said moveable plate move away from the first magnet on the stationary magnet plate when said moveable magnet plate is moving in a second direction; and an actuator operatively associated with said moveable magnet plate for moving said moveable magnet plate in the first and second directions.

16. The magnet assembly of claim 15, wherein said stationary magnet plate includes a fourth magnet positioned in spaced apart relation to said first magnet so that the second and third magnets on said moveable plate are located between the first and fourth magnets on said stationary plate.

17. The magnet assembly of claim 16, further comprising a mounting plate positioned adjacent said stationary magnet plate, wherein said stationary magnet plate is fixedly mounted to said mounting plate and wherein said moveable magnet plate is slidably mounted to said mounting plate.

18. The magnet assembly of claim 17, further comprising a first linear journal and a second linear journal mounted to said mounting plate in spaced-apart relation and wherein said moveable magnet plate is slidably engaged with said first and second linear journals.

19. The magnet assembly of claim 18, wherein said actuator includes an actuator control system for operating the actuator to move said moveable magnet plate from the center position to a first end position and from the center position to a second end position.

20. A magnet assembly for producing a plasma-confining magnetic field over the surface of a target, comprising:

stationary magnet plate means having first magnet means mounted thereon;

moveable magnet plate means having second magnet means mounted thereon and third magnet means mounted thereon at a position adjacent the second magnet means so that a pole axis of the second magnet means is substantially perpendicular to a pole axis of the third magnet means, said moveable magnet plate means being positioned adjacent said stationary magnet plate means so that the plasma-confining magnetic field is established between the first, second, and third magnet means, said moveable magnet plate means being moveable between a center position and an end position; and actuator means operatively associated with said moveable magnet plate means for moving said moveable magnet plate means with respect to said stationary magnet plate means so that said moveable magnet plate means is located at about the center position for a time that is greater than a time when said moveable magnet plate means is located at about the end position.

21. A method for producing a plasma confining magnetic field over a front surface of a target, comprising:

positioning a magnet assembly adjacent a back surface of the target, the magnet assembly including a stationary magnet plate having a first magnet mounted thereon and a moveable magnet plate having a second magnet mounted thereon and a third magnet mounted thereon at a position adjacent the second magnet so that a pole axis of the second magnet is substantially perpendicular to a pole axis of the third magnet and so that the plasma confining magnetic field is established between the first, second, and third magnets, the moveable magnet plate being moveable between a center position and an end position; and moving the moveable magnet plate with respect to the stationary magnet plate so that the moveable magnet plate is located at about the center position for a time that is greater than a time when the moveable magnet plate is located at about the end position.

* * * * *